United States Patent
Parker et al.

(10) Patent No.: US 7,038,508 B2
(45) Date of Patent: May 2, 2006

(54) METHODS AND APPARATUSES FOR DETECTING CLOCK LOSS IN A PHASE-LOCKED LOOP

(75) Inventors: Rachael J. Parker, Forest Grove, OR (US); Hon-Mo Raymond Law, Beaverton, OR (US); Timothy D. Low, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 10/836,645

(22) Filed: Apr. 30, 2004

(65) Prior Publication Data

US 2005/0242852 A1    Nov. 3, 2005

(51) Int. Cl.
*H03L 7/06* (2006.01)

(52) U.S. Cl. .................... 327/156; 327/147; 327/18
(58) Field of Classification Search ............... 327/20, 327/40, 42, 43, 47–49, 144–147, 150, 151, 327/154–156, 159, 160, 162, 163
See application file for complete search history.

(56) References Cited

U.S. PATENT DOCUMENTS

| | | | | |
|---|---|---|---|---|
| 4,374,361 A | * | 2/1983 | Holden | 327/20 |
| 5,479,420 A | * | 12/1995 | Hong et al. | 714/814 |
| 5,548,250 A | * | 8/1996 | Fang | 327/147 |
| 5,561,390 A | * | 10/1996 | Hiiragizawa | 327/147 |
| 5,570,382 A | * | 10/1996 | Miyamoto | 714/814 |
| 5,610,561 A | * | 3/1997 | Zarrabian | 331/49 |
| 5,903,748 A | * | 5/1999 | McCollough et al. | 713/503 |
| 5,946,362 A | * | 8/1999 | Ha | 375/357 |
| 6,008,671 A | * | 12/1999 | Kang | 327/20 |
| 6,252,466 B1 | * | 6/2001 | Kawamura | 331/25 |
| 6,466,058 B1 | * | 10/2002 | Goldman | 327/49 |
| 6,469,533 B1 | | 10/2002 | Kurd et al. | 324/763 |
| 6,731,146 B1 | * | 5/2004 | Gallardo | 327/158 |

* cited by examiner

*Primary Examiner*—Kenneth B. Wells
*Assistant Examiner*—Hai L. Nguyen
(74) *Attorney, Agent, or Firm*—Schwabe, Williamson & Wyatt, P.C.

(57) ABSTRACT

Embodiments of the present invention describe methods and apparatuses for detecting signal loss in circuits such as a phase-locked loop (PLL). In one embodiment a PLL is equipped with detection logic to detect loss of a reference clock provided to the PLL and a feedback clock generated by the PLL.

23 Claims, 8 Drawing Sheets

METHODS AND APPARATUSES FOR DETECTING CLOCK LOSS IN A PHASE-LOCKED LOOP

FIELD OF THE INVENTION

Disclosed embodiments of the present invention relate to the field of integrated circuits and more particularly to Phase Locked Loops.

BACKGROUND OF THE INVENTION

Phase-locked loops (PLLs) are widely used in timing circuits/blocks associated with data communications, local area networks, processors, and data storage applications to name just a few. A PLL is an electronic circuit that is often employed as a frequency synthesizer in which an oscillator frequency is divided down to a reference frequency that is derived from an accurate source. In PLLs, particularly those used for frequency synthesis in processors, it is often beneficial to detect the loss of an input reference clock as well as the loss of a feedback clock produced by the PLL. Upon detecting loss of a reference clock, it is often desirable to power down the PLL as the circuit may become unstable resulting in an unreliable output clock signal. Similarly, loss of the feedback clock can occur e.g. if the bandwidth of the feedback path is less than the maximum frequency (Fmax) of a voltage-controlled oscillator (VCO) within the PLL. In this case, the PLL typically needs to be reset or pulled out of this state before reliable operation of the PLL can resume.

In the past, detection of reference clock and/or feedback clock signals typically has been performed using analog timers. However, given the reduced headroom and increased leakage often occurring in contemporary logic processes, such analog timers are becoming increasingly difficult to reliably design.

BRIEF DESCRIPTION OF THE DRAWINGS

Embodiments of the invention are illustrated by way of example and not by way of limitation in the figures of the accompanying drawings, in which the like references indicate similar elements and in which.

DETAILED DESCRIPTION OF EMBODIMENTS OF THE INVENTION

In the following detailed description, numerous specific details are set forth in order to provide a thorough understanding of embodiments of the present invention. However, those skilled in the art will understand that such embodiments may be practiced without these specific details. In other instances, well known methods, procedures, components, and circuits have not been described in detail.

Although various discrete operations will be described herein, the mere order of description should not be construed as to imply that these operations are necessarily performed in the order they are presented.

Furthermore, reference throughout this specification to "one embodiment" or "an embodiment" means that a particular feature, structure, or characteristic described in connection with the embodiment is included in at least one embodiment of the invention. Thus, the appearances of the phrases "in one embodiment" or "in an embodiment" in various places throughout this specification are not necessarily all referring to the same embodiment or invention, although they may. Moreover, the particular features, structures, or characteristics described may be combined in any suitable manner in one or more embodiments. Lastly, the terms "comprising", "including", "having", and the like, as used in the present application, are intended to be synonymous.

Embodiments of the present invention describe methods and apparatuses for detecting signal loss in circuits such as a phase-locked loop. In one embodiment a PLL is equipped with detection logic to detect loss of a reference clock provided to the PLL and a feedback clock generated by the PLL.

Figure 1:
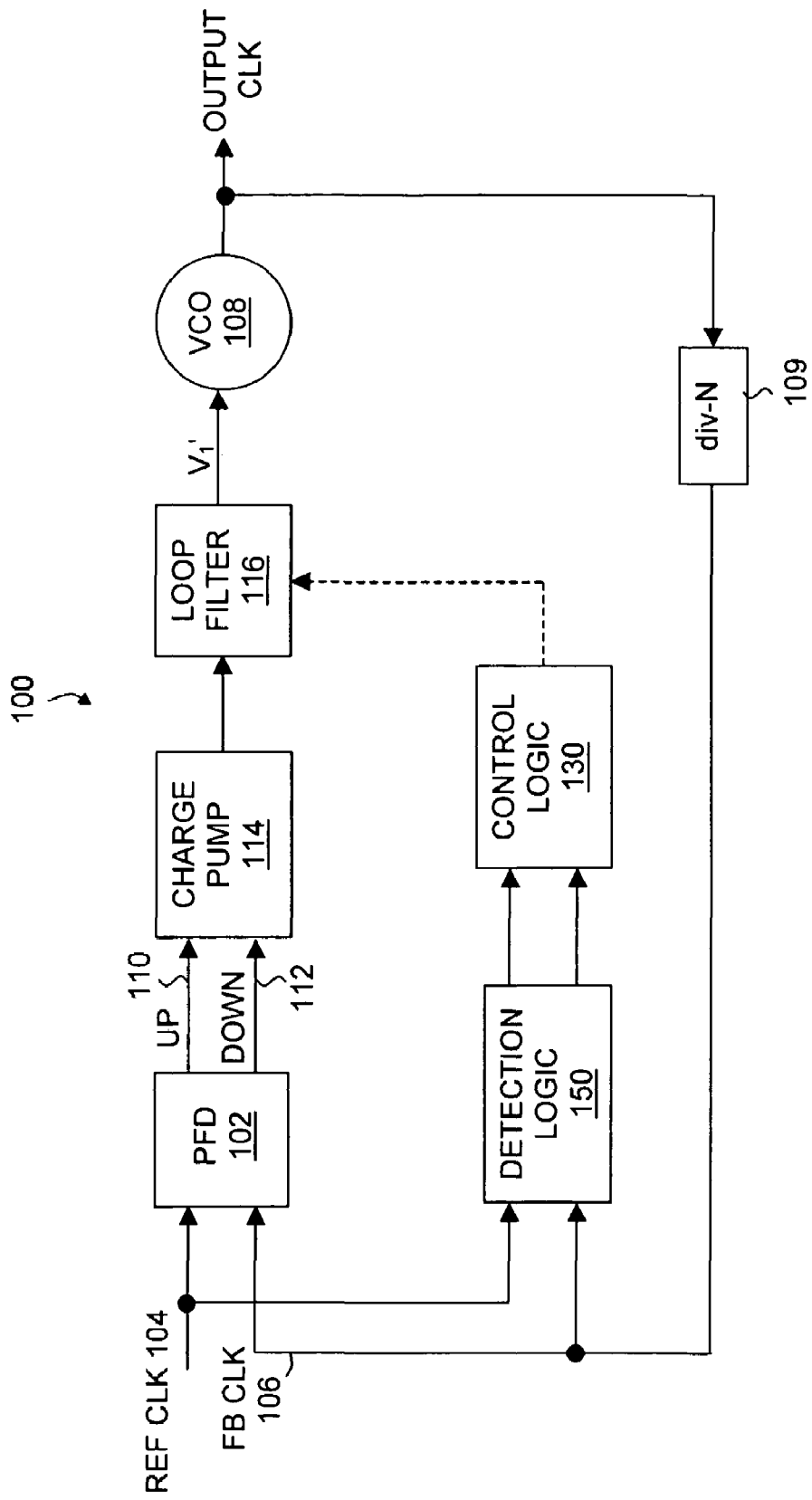
FIG. 1 illustrates an example PLL equipped with detection logic in accordance with embodiments of the present invention.

FIG. 1 illustrates an example PLL equipped in accordance with embodiments of the present invention. In one embodiment, PLL 100 represents a self-biased PLL including phase-frequency detector (PFD) 102, charge pump 114, loop filter 116, voltage controlled oscillator (VCO) 108, and div-N 109 coupled together as shown. During lock acquisition of the PLL, PFD 102 may attempt to correct for frequency differences and/or phase misalignments between reference clock signal 104 and feedback clock signal 106 (in the form of a frequency divided output signal of VCO 108). The correction may come in the form of UP/DOWN control signals 110, 112 whose pulse-widths are typically proportional to the frequency and/or phase error between the two input signals of PFD 102. The pulse width of the UP/DOWN control signals 110, 112 informs charge-pump 114 as to how much current to source or sink from loop filter 116 in order to obtain a desired loop control voltage V1'. The control voltage typically controls or otherwise influences the frequency of the target output clock signal generated by VCO 108. In one embodiment as the control voltage decreases, the frequency of the output clock signal of the PLL may increase. Conversely, when the control voltage increases, the frequency of the output clock signal of the PLL may decrease.

Although PLL 100 is described as including a voltage controlled oscillator (e.g. VCO 108), PLL 100 may instead include any other type of controlled oscillator, such as a current controlled oscillator (ICO), without departing from the spirit and scope of the disclosure. In the event PLL 100 includes an ICO, PLL 100 may further include a voltage-to-current converter communicatively coupled between charge pump 114 and the ICO.

PLL 100 may be further equipped with control logic 130 to source or sink current from loop filter 116 in order to help achieve a desired loop control voltage V1'. For example, control logic 130 may facilitate discharge of control voltage V1' towards ground, which in turn may cause PLL 100 to wake up and start generating an output signal having a frequency that increases to match the target output frequency. Furthermore, control logic 130 may facilitate charging of control voltage V1' toward Vcc, which in turn may cause PLL 100 to enter a sleep mode in which operation of the PLL is essentially stopped. In one embodiment, control logic 130 may facilitate the charging and/or discharging of loop filter 116 based upon one or more indications received from detection logic 150.

Figure 2:
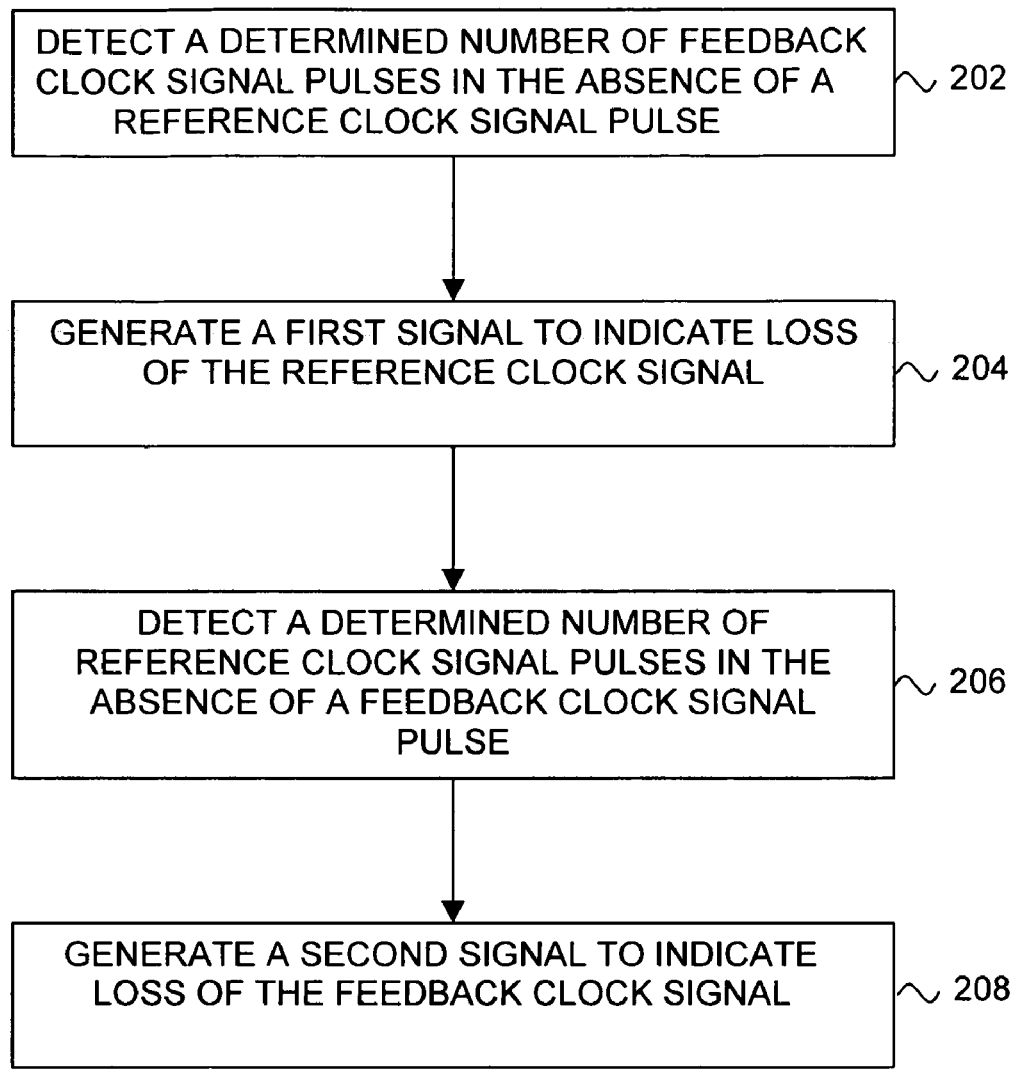
FIG. 2 is a flow diagram illustrating an example operational flow of detection logic 150 in accordance with one embodiment of the present invention.

In accordance with various embodiments of the present invention, PLL 100 additionally may be advantageously equipped with digital detection logic 150 to facilitate detection of clock signal losses in the PLL. FIG. 2 is a flow diagram illustrating an example operational flow of detection logic 150 in accordance with one embodiment of the present invention. In the illustrated embodiment, the process may begin with detection logic 150 detecting a determined number of signal pulses in association with feedback clock signal 106 before detecting a reference clock signal pulse, block 202. In response, detection logic 150 may generate a signal to indicate loss of reference clock signal 104, block 204. At block 206, detection logic 150 may detect a determined number of signal pulses in association with reference clock signal 104 before detecting a feedback clock signal pulse. In response, detection logic 150 may then generate a signal to indicate loss of feedback clock signal 106, block 208. In one embodiment, detection logic 150 may provide a digital signal to control logic 130 to indicate loss of reference clock signal 104 and/or feedback clock signal 106, however other indicating methods (whether electrical, optical, electro-optical, or mechanical) may be used.

In one embodiment, in response to control logic 130 receiving an indication as to the loss of reference clock signal 104 (e.g. via detection logic 150), control logic 130 may facilitate in the transitioning of PLL 100 into a 'Sleep' state in which operation of PLL 100 is essentially stopped. Similarly, in response to control logic 130 receiving an indication as to the loss of feedback clock signal 106 (e.g. via detection logic 150), control logic 130 may facilitate in the transitioning of PLL 100 into a 'Yank' state, in which operation of PLL 100 is paused. In one embodiment, upon transitioning into a Yank state, PLL 100 may remain in the Yank state for a set period of time (e.g. as may be determined by control logic 130), and may then be released from the Yank state to provide PLL 100 with an opportunity to recover back to normal operation.

Figure 3:
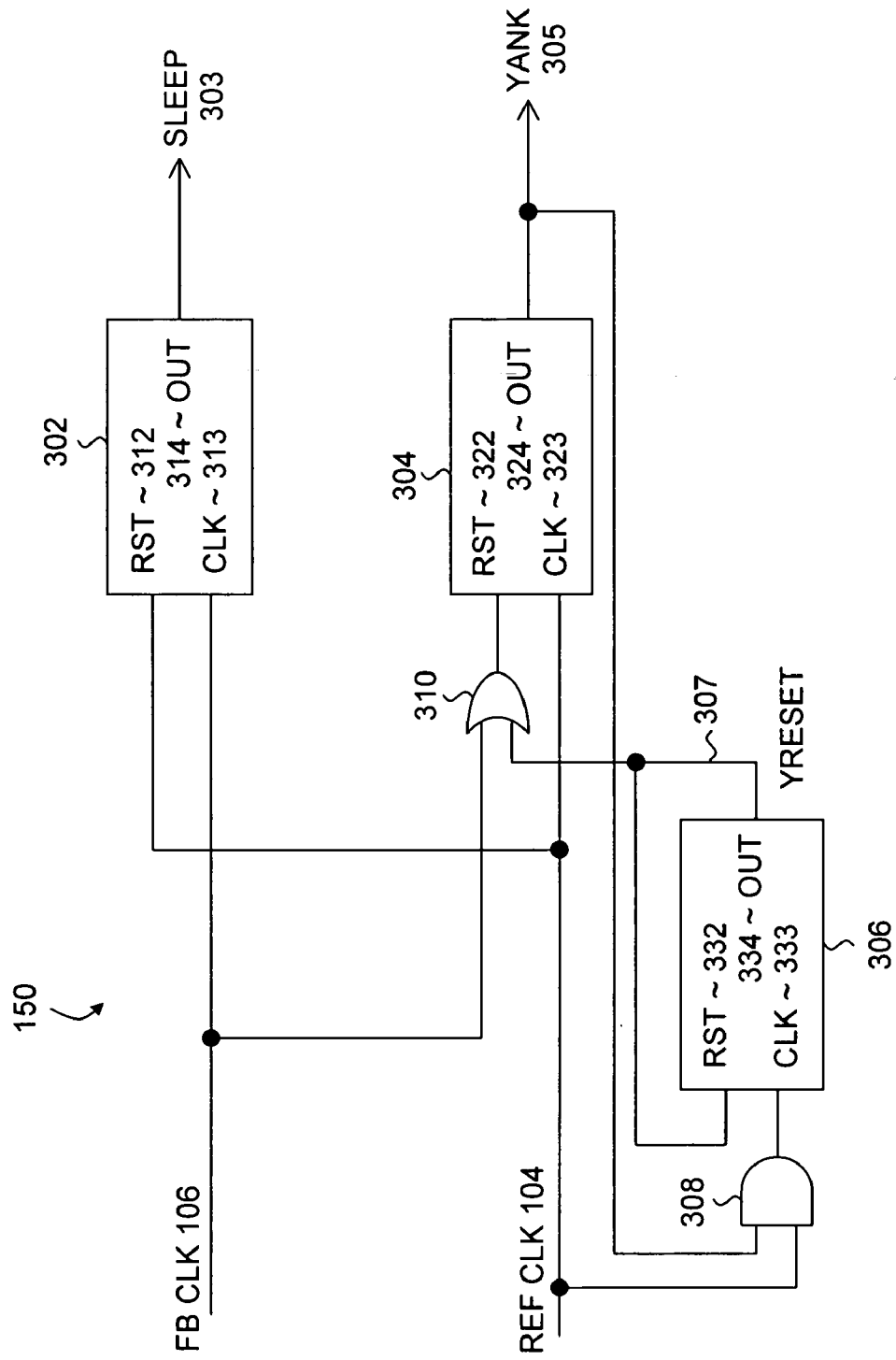
FIG. 3 is a schematic diagram illustrating an overview of one embodiment of detection logic 150.

FIG. 3 is a block diagram illustrating an overview of one embodiment of detection logic 150. In the illustrated embodiment, detection logic 150 includes logic blocks 302, 304 and 306, as well as logic gates 308 and 310 coupled together as shown. In one embodiment, logic blocks 302, 304 and 306 are each equipped to generate an output signal in response to receiving a determined number of input clock signals in the absence of a reset signal. In one embodiment, each of logic blocks 302, 304 and 306 represent one or more digital counters. However, in other embodiments, one or more of logic blocks 302, 304 and 306 may represent one or more shift registers or similar devices.

In the illustrated embodiment, feedback clock signal 106 is communicatively coupled to clock terminal 313 of logic block 302 and reset terminal 322 of logic block 304. Similarly, reference clock signal 104 is communicatively coupled to reset terminal 312 of logic block 302 and clock terminal 323 of logic block 304. As such, reference clock signal 104 may act to reset logic block 302 and to clock logic block 304, while feedback clock signal 106 may act to clock logic block 302 and to reset logic block 304. In one embodiment, if logic block 302 receives a determined number of input clock pulses via clock terminal 313 before it receives a reset signal via reset terminal 312, logic block 302 may assert sleep signal 303 (via output terminal 314) causing PLL 100 to transition into a sleep state. Similarly, if logic block 304 receives a determined number of input clock pulses via clock terminal 323 before it receives a reset signal via reset terminal 322, logic block 304 may assert yank signal 305 (via output terminal 324) causing PLL 100 to transition into a Yank state.

In one embodiment, yank signal 305 is communicatively coupled to clock terminal 333 of logic block 306 by way of logic gate 308. In one embodiment, logic gate 308 represents a logical AND gate used to provide a clock pulse to clock terminal 333 upon receiving a signal pulse from reference clock signal 104 while yank signal 305 is asserted. In one embodiment, upon receiving a determined number of signal pulses from reference clock signal 104 via clock terminal 333, logic block 306 generates a yreset signal which may act to reset logic block 304 (via signal line/trace 307 and logic gate 310) as well as logic block 306. In one embodiment logic gate 310 is a logical OR gate designed to allow the yreset signal to reset logic block 304, causing PLL 100 to transition out of a previously entered Yank state. In accordance with one embodiment, upon PLL 100 transitioning into a Yank state e.g. as manifested by the assertion of yank signal 305, logic block 306 may delay a determined amount of time before asserting a yreset signal causing yank signal 305 to be deasserted and PLL 100 to attempt to transition to a normal operating state. As such, PLL 100 is given a time period with which to correct its operation. In another embodiment, feedback clock signal 106 (or a number of counts of the feedback clock) may be used to reset block 304 without the use of a timed duration from logic block 306.

Figure 4:
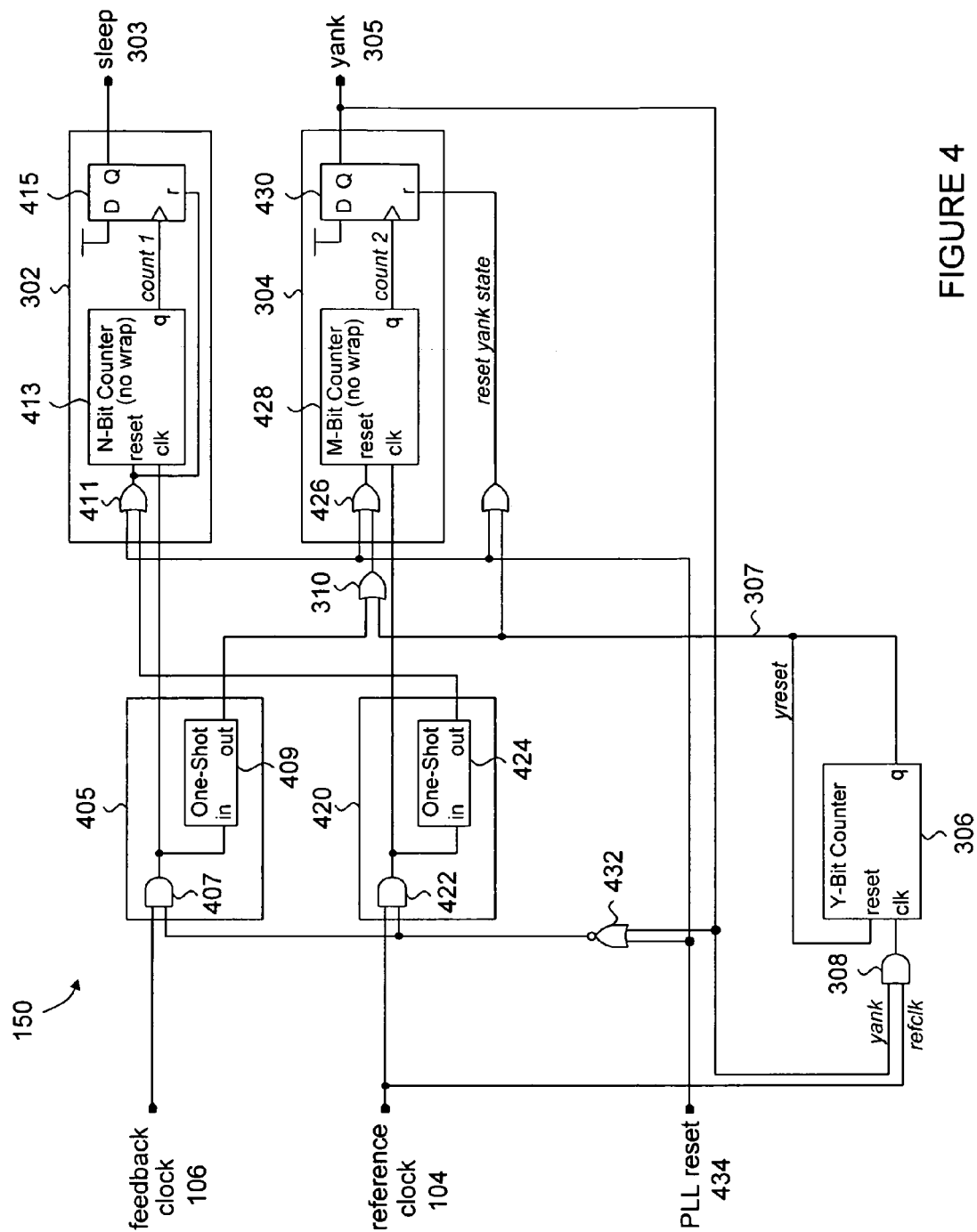
FIG. 4 is a schematic diagram illustrating a more detailed view of detection logic 150 in accordance with one embodiment.

FIG. 4 is a schematic diagram illustrating a more detailed view of detection logic 150 in accordance with one embodiment. In the illustrated embodiment, detection logic 150 further includes logic block 405 (including AND gate 407 and one-shot circuit 409) and logic block 420 (including AND gate 422 and one-shot circuit 424). Furthermore, logic block 302 includes OR gate 411, N-bit counter 413 and latch 415 coupled together as shown, while logic block 304 includes OR gate 426, M-bit counter 428 and latch 430 similarly coupled together as shown.

In one embodiment, N-bit counter 413 may represent a 4-bit counter such that if a clock edge of reference clock signal 104 is not received within $2^4-1$ edges of feedback clock signal 106, counter 413 will "time-out" causing latch 415 to latch a 'one' thereby asserting sleep signal 303. In one embodiment, M-bit counter 428 may represent a 7-bit counter such that if a clock edge of feedback clock signal 106 is not received within $2^7-1$ edges of reference clock signal 104, counter 428 will "time-out" causing latch 430 to latch a 'one' thereby asserting yank signal 305. Logic gates 411 and 426 allow N-bit counter 413 and M-bit counter 428 to be reset via PLL reset signal 434. Furthermore, logic gate 432 operates such that the respective states of feedback clock signal 106 and reference clock signal 104 are ignored by logic blocks 302 and 304 while either PLL reset signal 434 or yank signal 305 are asserted. As such, this in part allows Y-bit counter 306 to reset the yank state after a determined delay period. In one embodiment, Y-bit counter may represent a 7-bit counter such that the yreset signal is output after 2^7-1 reference clock edges have been received while PLL 100 is in the yank state.

Figure 5:
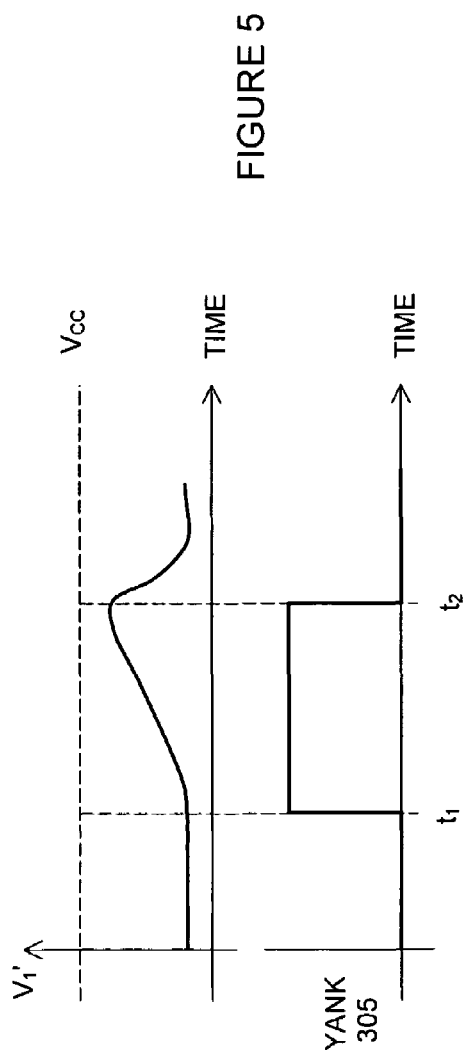
FIG. 5 is a timing diagram illustrating assertion of yank signal 305 in accordance with one embodiment of the invention.

FIG. 5 is a timing diagram illustrating assertion of yank signal 305 in accordance with one embodiment of the invention. In the illustrated embodiment, yank signal 305 is asserted as a result of V1' being at such a level to cause the frequency of the output clock to be above the bandwidth of the clock distribution feedback. As shown, as yank signal 305 is asserted at time t1, control logic 130 causes control voltage V1' of PLL 100 to be pulled towards Vcc causing e.g. the frequency of the output clock of PLL 100 to decrease. Upon yank signal 305 becoming deasserted at time t2, PLL 100 immediately begins to reacquire lock. In the illustrated embodiment, this is manifested by V1' decreasing with e.g. an accompanying increase in the output clock frequency. Depending upon how VCO 108 may be biased, the frequency of the output clock signal of PLL 100 may instead decrease as V1' is decreased to ground, or increase as V1' is increased towards VCC.

Figure 6:
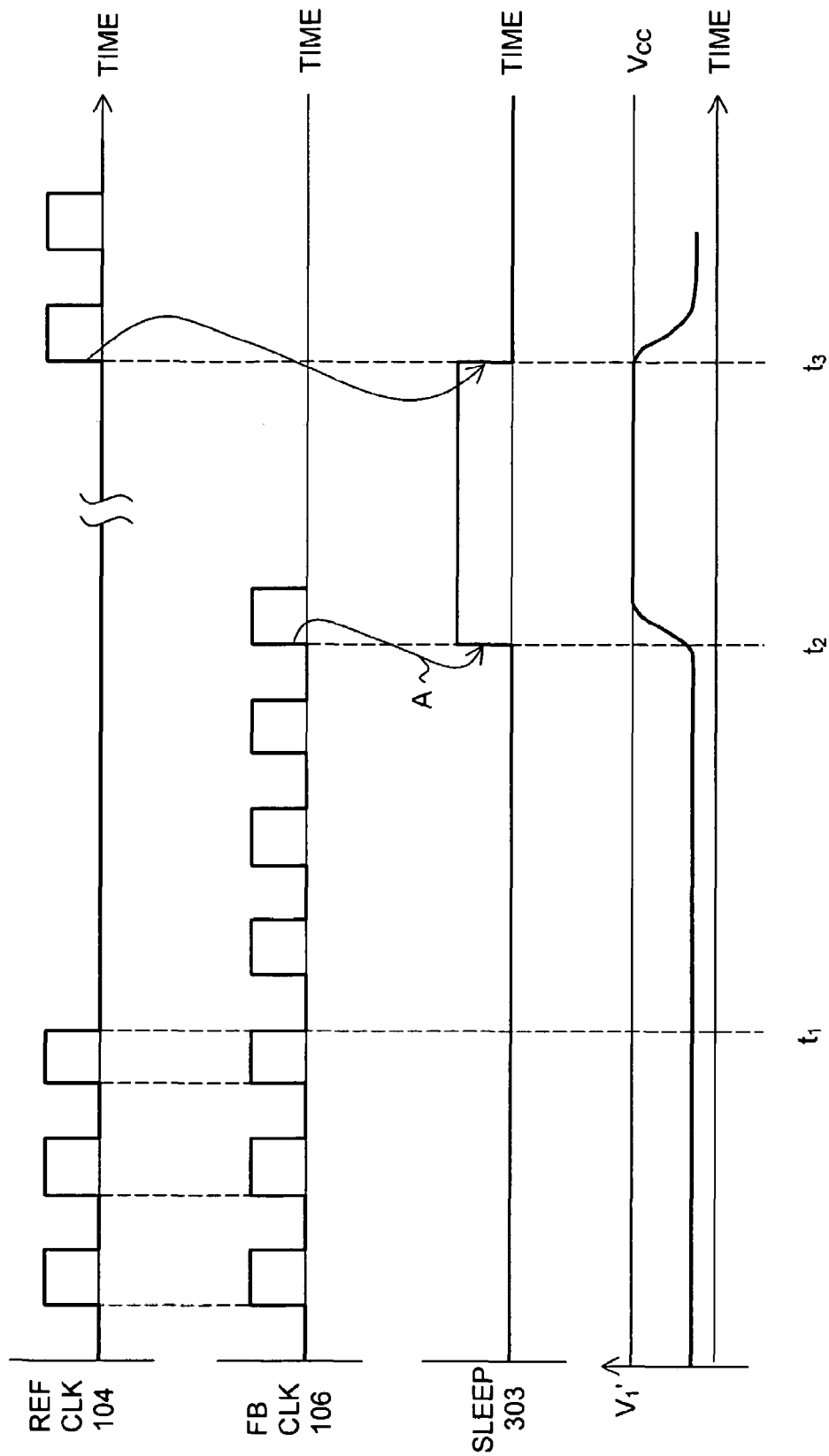
FIG. 6 is a timing diagram illustrating assertion of sleep signal 303 in accordance with one embodiment of the invention.

FIG. 6 is a timing diagram illustrating assertion of sleep signal 303 in accordance with one embodiment of the invention. As shown, reference clock signal 104 is no longer detected at time t1 while feedback clock signal 106 continues to operate. In the illustrated embodiment, upon counter 413 detecting four (or M) clock edges from feedback clock signal 106, sleep signal 303 is asserted as shown by arrow 'A'. In turn, control voltage V1' of PLL 100 is caused to increase to VCC by control logic 130, further causing PLL 100 to enter a sleep mode where PLL 100 winds down such that the output clock signal becomes negligible. At time t3, a clock edge of the reference clock signal 104 is again detected. This resets the sleep signal 303, which triggers control logic 130 to begin normal lock acquisition. In the illustrated embodiment, this causes control voltage V1' to decrease and the output clock frequency of PLL 100 to correspondingly increase.

Figure 7:
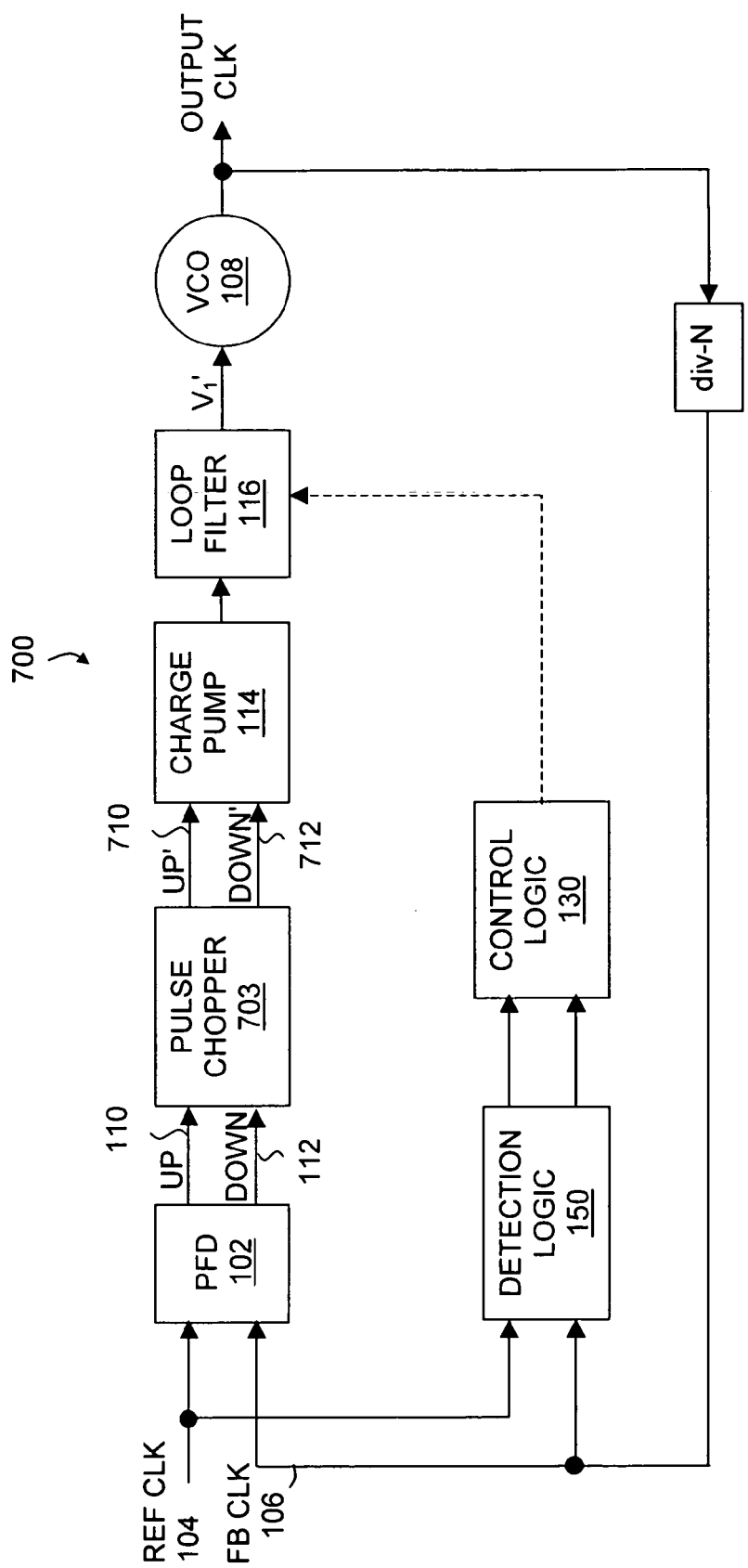
FIG. 7 illustrates a PLL equipped with pulse chopper circuitry in accordance with one embodiment of the present invention.

FIG. 7 illustrates a PLL equipped with pulse chopper circuitry in accordance with one embodiment of the present invention. As shown, PLL 700 is similarly equipped as PLL 100 with the exception that PLL 700 includes additional "pulse chopper" circuitry 703. As shown, pulse chopper 703 is disposed between PFD 102 and charge pump 114 to produce modified output control signals (e.g., UP' 710 and DOWN' 712) based upon output signals (UP 110 & DOWN 112) from PFD 102. In one embodiment, output control signals generated by pulse chopper 703 include a reduced or otherwise limited pulse width based upon an amount of delay injected by pulse chopper 703. These output control signals generated by pulse chopper 703 facilitate in preventing the PLL from responding too quickly during loss of a reference clock. For example, in the event of a loss of a reference clock, PLL 700 may immediately attempt to lower its frequency because PFD 102 will direct it to start pumping V1 towards Vcc. If that happens too quickly, VCO 108 could "wind down" before enough feedback clock signals are emitted from VCO 108 (e.g. to flush counter 302 of FIGS. 3 & 4). In that event, PLL 700 would wind down but control logic 130 would not be able to indicate a "sleep" mode to the rest of the core. Pulse chopper 703 causes VCO 108 to wind down slowly enough that the loss of reference clock signal 104 can properly be detected and PLL 700 can shut down accordingly.

Figure 8:
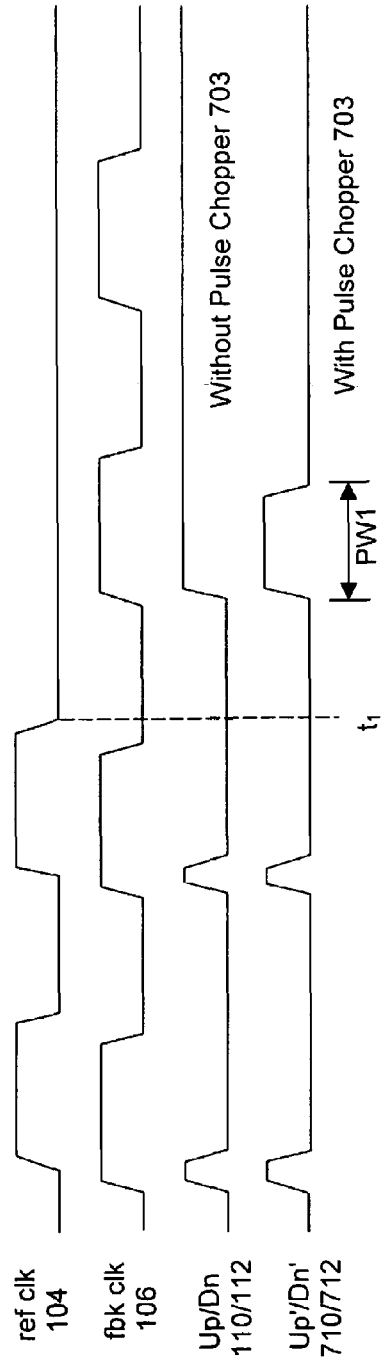
FIG. 8 is a timing diagram illustrating example operation of pulse chopper circuitry 700.

FIG. 8 is a timing diagram illustrating example operation of pulse chopper circuitry 700. Referring to FIG. 8, it can be seen that in the absence of pulse chopper 703, as PLL 700 enters a sleep state (e.g. manifested by reference clock signal 104 disappearing) at time t1, feedback clock signal 106 continues to operate. This may cause PFD 102 to overcompensate (e.g. via UP or DOWN signal 110/112) in an attempt to decrease the frequency of feedback clock signal 106 to match that of reference clock signal 104. However, in the presence of pulse chopper 703, the pulse width of output of PFD 102 can be modified or 'chopped' such that the pulse width of the resulting signal (e.g. UP' or DOWN' signal 710/712) may be limited to a maximum duration (PW1).

Figure 9:
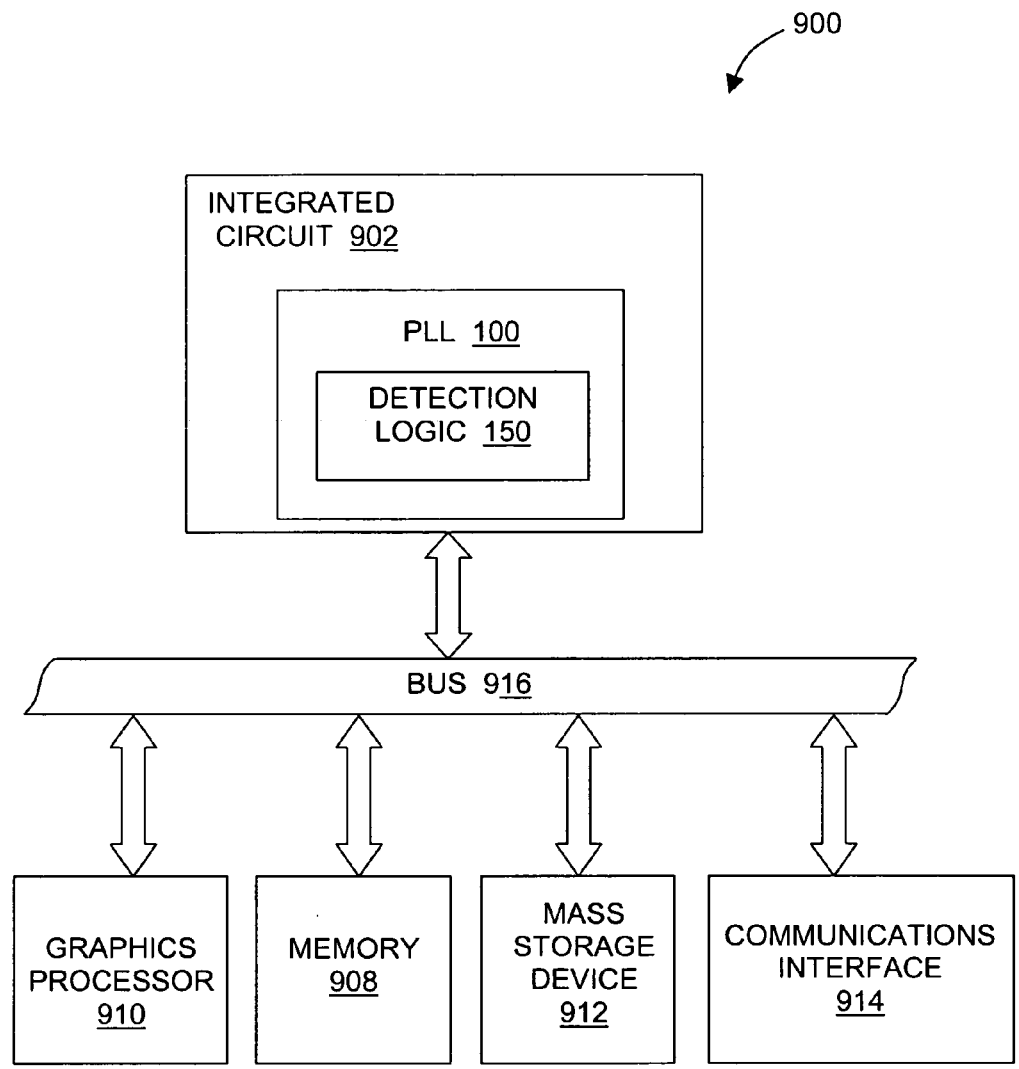
FIG. 9 illustrates one of many possible systems in which PLL 100 incorporated with detection logic 150 in accordance with embodiments of the invention may be used.

FIG. 9 illustrates one of many possible systems in which PLL 100 incorporated with detection logic 150 may be used. In one embodiment, PLL 100 is implemented in an integrated circuit (IC) 902. In one embodiment, IC 902 may be a processor. In alternative embodiments, IC 902 may be an application specific IC (ASIC).

In the illustrated embodiment of FIG. 9, system 900 also includes a main memory 908, a graphics processor 910, a mass storage device 912 and a communications interface 914 coupled to each other by way of a bus 916, as shown. Examples of the memory 908 include but are not limited to static random access memory (SRAM) and dynamic random access memory (DRAM). Examples of the mass storage device 912 include but are not limited to a hard disk drive, a compact disk drive (CD), a digital versatile disk driver (DVD), and so forth. Examples of the communications interface 914 include but are not limited to a network interface (wired or wireless), keyboard, cursor control devices, a display, and so forth. Examples of the bus 916 include but are not limited to a peripheral control interface (PCI) bus, an Industry Standard Architecture (ISA) bus, and so forth. In various embodiments, the system 900 may be a variety of devices including, but not limited to a wireless mobile phone, a personal digital assistant, a pocket PC, a tablet PC, a notebook PC, a desktop computer, a set-top box, an entertainment unit, a digital camera, a DVD player, and a server. Moreover, one or more components 908, 910, 913, 914, and 916 of system 900 may be incorporated into one or more chip-sets, each corresponding to one or more integrated circuits.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. For example, the composition and configuration of PLL 100 may differ from that illustrated in FIG. 1 without departing from the spirit and scope of this disclosure. More specifically, although PLL 100 is shown as being equipped with a single charge pump 114, PLL 100 may nonetheless include one or more additional charge pumps. Similarly, PLL 100 may include other collateral circuits such as lock detectors, bias generation circuitry, amplification circuitry, input and output buffer circuitry just the same.

What is claimed is:

1. A phase-locked loop comprising:
   a first digital logic element to receive a feedback clock signal and a reference clock signal and to generate a sleep signal upon the detection of a first number of feedback clock signal pulses in the absence of a reference clock signal pulse; and
   a second digital logic element to receive the feedback clock signal and the reference clock signal, and to generate a yank signal upon the detection of a second number of reference clock signal pulses in the absence of a feedback clock signal pulse,
   wherein assertion of the sleep signal facilitates causing the phase-locked loop to enter a sleep state in which operation of the phase-locked loop is effectively shut down,
   wherein assertion of the yank signal facilitates causing the phase-locked loop to enter a standby state in which operation the phase-locked loop is effectively paused.

2. The phase-locked loop of claim 1, wherein at least one of the first and second digital logic elements comprises a shift register.

3. The phase-locked loop of claim 1, further comprising:
   startup circuitry equipped to receive the sleep signal and yank signal and to influence generation of a control voltage based upon a sleep signal state and a yank signal state.

4. The phase-locked loop of claim 1, wherein at least one of the first and second digital logic elements comprises a counter.

5. The phase-locked loop of claim 4, wherein the first number and second number are not equal.

6. A method comprising:
   generating a first indication to indicate loss of a reference clock signal upon detecting a determined number of feedback clock signal pulses in the absence of a reference clock signal pulse, wherein the first indication facilitates causing a phase-locked loop to enter a sleep state in which operation of the phase-locked loop is effectively shut down; and
   generating a second indication to indicate loss of a feedback clock signal upon detection of a determined number of reference clock signal pulses in the absence of a feedback clock signal pulse, wherein the second indication facilitates causing the phase-locked loop to enter a temporary yank state in which operation of the phase-locked loop is effectively paused.

7. The method of claim 6, wherein the operation of the phase-locked loop is paused for a determined number of reference clock signal pulses.

8. The method of claim 7, further comprising:
   generating a third indication after passage of the determined number of reference clock signal pulses, the third indication facilitating removing the phase-locked loop from the yank state.

9. A phase-locked loop comprising:
   a first digital counter having a first clock terminal, a first reset terminal, and a first output terminal; and
   a second digital counter coupled to the first digital counter and having a second clock terminal, a second reset terminal, and a second output terminal;
   the first reset terminal and the second clock terminal to receive a reference clock signal provided to the phase-locked loop, and the first clock terminal and the second reset terminal to receive a feedback clock signal generated by the phase-locked loop.

10. The phase-locked loop of claim 9, further comprising:
    a loop filter to generate a control voltage; and
    startup circuitry coupled to the loop filter and equipped to receive the sleep signal and yank signal to influence generation of the control voltage by the loop filter.

11. The phase-locked loop of claim 9, further comprising a first latch and a second latch, the first latch coupled to the first output terminal such that an output signal generated at the first output terminal causes the phase-locked loop to enter a sleep state, and the second latch coupled to the second output terminal such that the output signal generated at the second output terminal causes the phase-locked loop to enter a yank state.

12. The phase-locked loop of claim 11, further comprising:
    a third counter having a third clock terminal, a third reset terminal and a third output terminal, wherein an output signal generated at the second output terminal is provided to the third clock terminal, and an output signal generated at the third output terminal is provided to the second reset terminal.

13. The phase-locked loop of claim 12, further comprising logic coupled to the third clock terminal of the third counter such that the third counter is clocked based upon the reference clock signal and the output signal generated at the third output terminal.

14. The phase-locked loop of claim 12, wherein the output signal generated at the third output terminal is coupled to a fourth reset terminal on the second latch to reset the yank state based upon the output signal generated at the third output terminal of the third counter.

15. The phase-locked loop of claim 14, further comprising logic to disable the first and second counters upon the phase-locked loop entering the yank state.

16. An apparatus comprising:
    a voltage controlled oscillator;
    a first digital counter having a first clock terminal, a first reset terminal, and a first output terminal; and
    a second digital counter coupled to the first digital counter and having a second clock terminal, a second reset terminal, and a second output terminal,
    the first reset terminal and the second clock terminal to receive a reference clock signal, the first clock terminal and the second reset terminal to receive a feedback clock signal generated by the voltage controlled oscillator, and a selected one of the first and second output terminals to provide an indication based at least in part upon the reference clock signal and the feedback clock signal.

17. The apparatus of claim 16, further comprising:
    startup circuitry communicatively coupled to the first and second output terminals of the first and second digital counters and equipped to influence a control voltage associated with the oscillator based upon the indication.

18. The apparatus of claim 16, wherein the first clock terminal and the second reset terminal receive a divided-down version of the feedback clock signal generated by the voltage controlled oscillator.

19. The apparatus of claim 18, wherein the apparatus is a processor.

20. A system comprising:
    a bus;
    a processor coupled to the bus;

a network interface coupled to the bus; and
a phase-locked loop coupled to a selected one of the processor and the bus, the phase-locked loop including
a first digital counter having a first clock terminal, a first reset terminal, and a first output terminal, and
a second digital counter coupled to the first digital counter and having a second clock terminal, a second reset terminal, and a second output terminal,
the first reset terminal and the second clock terminal to receive a reference clock signal provided to the phase-locked loop, and the first clock terminal and the second reset terminal to receive a feedback clock signal generated by the phase-locked loop.

21. The system of claim 20, further comprising:
startup circuitry, wherein a selected one of the first and second output terminals provide an indication to the startup circuitry based at least in part upon the reference clock signal and the feedback clock signal.

22. The system of claim 20, further comprising:
a third counter having a third clock terminal, a third reset terminal and a third output terminal, wherein an output signal generated at the second output terminal is provided to the third clock terminal, and an output signal generated at the third output terminal is provided to the second reset terminal.

23. The system of claim 22, further comprising logic coupled to the third clock terminal of the third counter such that the third counter is clocked based upon the reference clock signal and the output signal generated at the third output terminal.

* * * * *